United States Patent
Park et al.

(10) Patent No.: US 12,294,379 B2
(45) Date of Patent: May 6, 2025

(54) CLOCK GENERATING CIRCUIT AND SEMICONDUCTOR APPARATUS USING THE SAME

(71) Applicant: SK hynix Inc., Icheon-si (KR)

(72) Inventors: Gyu Tae Park, Icheon-si (KR); Young Jae An, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 321 days.

(21) Appl. No.: 18/084,956

(22) Filed: Dec. 20, 2022

(65) Prior Publication Data

US 2024/0072810 A1    Feb. 29, 2024

(30) Foreign Application Priority Data

Aug. 26, 2022    (KR) .................. 10-2022-0107341

(51) Int. Cl.
*H03L 7/081* (2006.01)
*H03K 5/135* (2006.01)

(52) U.S. Cl.
CPC .......... *H03L 7/0816* (2013.01); *H03K 5/135* (2013.01)

(58) Field of Classification Search
None
See application file for complete search history.

(56) References Cited

U.S. PATENT DOCUMENTS

| 10,943,627 | B2 | 3/2021 | Polney | |
|---|---|---|---|---|
| 11,329,654 | B2* | 5/2022 | Choi | H03L 7/0816 |
| 11,750,201 | B2* | 9/2023 | Han | H03K 5/134 |
| | | | | 327/157 |

FOREIGN PATENT DOCUMENTS

KR    102106337 B1    5/2020

* cited by examiner

*Primary Examiner* — Cassandra F Cox
(74) *Attorney, Agent, or Firm* — WILLIAM PARK & ASSOCIATES LTD.

(57) ABSTRACT

A clock generating circuit includes a first division circuit and a second division circuit. The first division circuit is configured to generate a first group of internal clock signals by dividing a clock signal. The second division circuit is configured to generate a second group of internal clock signals by dividing a delayed clock signal, the delayed clock signal generated by an internal circuit delaying the clock signal. An operation timing of the second division circuit can be adjusted based on one of the first group of internal clock signals generated by the first division circuit.

20 Claims, 7 Drawing Sheets

CLOCK GENERATING CIRCUIT AND SEMICONDUCTOR APPARATUS USING THE SAME

CROSS-REFERENCES TO RELATED APPLICATION

The present application claims priority under 35 U.S.C. § 119(a) to Korean application number 10-2022-0107341, filed on Aug. 26, 2022, in the Korean Intellectual Property Office, which is incorporated herein by reference in its entirety.

BACKGROUND

1. Technical Field

The present disclosure relates to integrated circuit technology, and more particularly, to a clock generating circuit and a semiconductor apparatus using the same.

2. Related Art

An electronic device includes many electronic components, and among them, a computer system may include many semiconductor apparatuses each made of semiconductors. The semiconductor apparatuses constituting the computer system may communicate with each other by transmitting and receiving clock signals and data. The semiconductor apparatuses may perform data communication in synchronization with a clock signal. The semiconductor apparatuses may generate an internal clock signal from a received system clock signal to synchronize the system clock signal with the data and provide the internal clock signal to a data circuit. The data circuit may output the data to another semiconductor apparatus in synchronization with the internal clock signal. The semiconductor apparatus may include a clock distribution network and distribute the internal clock signal to the data circuit. As the operating speed of the computer system increases, the frequency of the system clock signal increases, and the semiconductor apparatus may generate an internal clock signal having a lower frequency from the system clock signal having a high frequency to perform a stable operation. The semiconductor apparatus may include a clock division circuit for generating the internal clock signal having a lower frequency by dividing a frequency of the system clock signal. For operational reliability of the semiconductor apparatus, the clock division circuit generates the internal clock signal synchronized with a rising edge or a falling edge of the system clock signal.

SUMMARY

A clock generating circuit in accordance with an embodiment of the present disclosure may include a first division circuit, an internal circuit, a second division circuit, and an enable control circuit. The first division circuit may be configured to generate a first group of internal clock signals by dividing a clock signal. The internal circuit may be configured to generate a delayed clock signal by delaying the clock signal based on an enable signal. The second division circuit may be configured to generate a second group of internal clock signals by dividing the delayed clock signal. The enable control circuit may be configured to generate the enable signal based on one of the first group of internal clock signals.

A clock generating circuit in accordance with an embodiment of the present disclosure may include a first division circuit, a buffer circuit, a delay locked loop circuit, a second division circuit, and an enable control circuit. The first division circuit may be configured to generate a first group of internal clock signals by dividing a clock signal. The buffer circuit may be configured to buffer the clock signal based on an enable signal. The delay locked loop circuit may be configured to generate a delayed clock signal by delaying an output signal of the buffer circuit. The second division circuit may be configured to generate a second group of internal clock signals by dividing the delayed clock signal. The enable control circuit may be configured to generate the enable signal based on one of the first group of internal clock signals and a delay locked loop reset signal.

A semiconductor apparatus in accordance with an embodiment of the present disclosure may include a first division circuit, a command path circuit, a clock path circuit, a second division circuit, and a command synchronization circuit. The first division circuit may be configured to generate a first group of internal clock signals by dividing a clock signal. The command path circuit may be configured to generate an internal command signal by synchronizing a command signal with at least one of the first group of internal clock signals, and to generate a delayed command signal by delaying the internal command signal. The clock path circuit may be activated based on one of the first group of internal clock signals and configured to generate a delayed clock signal by delaying a phase of the clock signal. The second division circuit may be configured to generate a second group of internal clock signals by dividing the delayed clock signal. The command synchronization circuit may be configured to generate an internal control signal by synchronizing the delayed command signal with at least one of the second group of internal clock signals.

DETAILED DESCRIPTION

Figure 1:
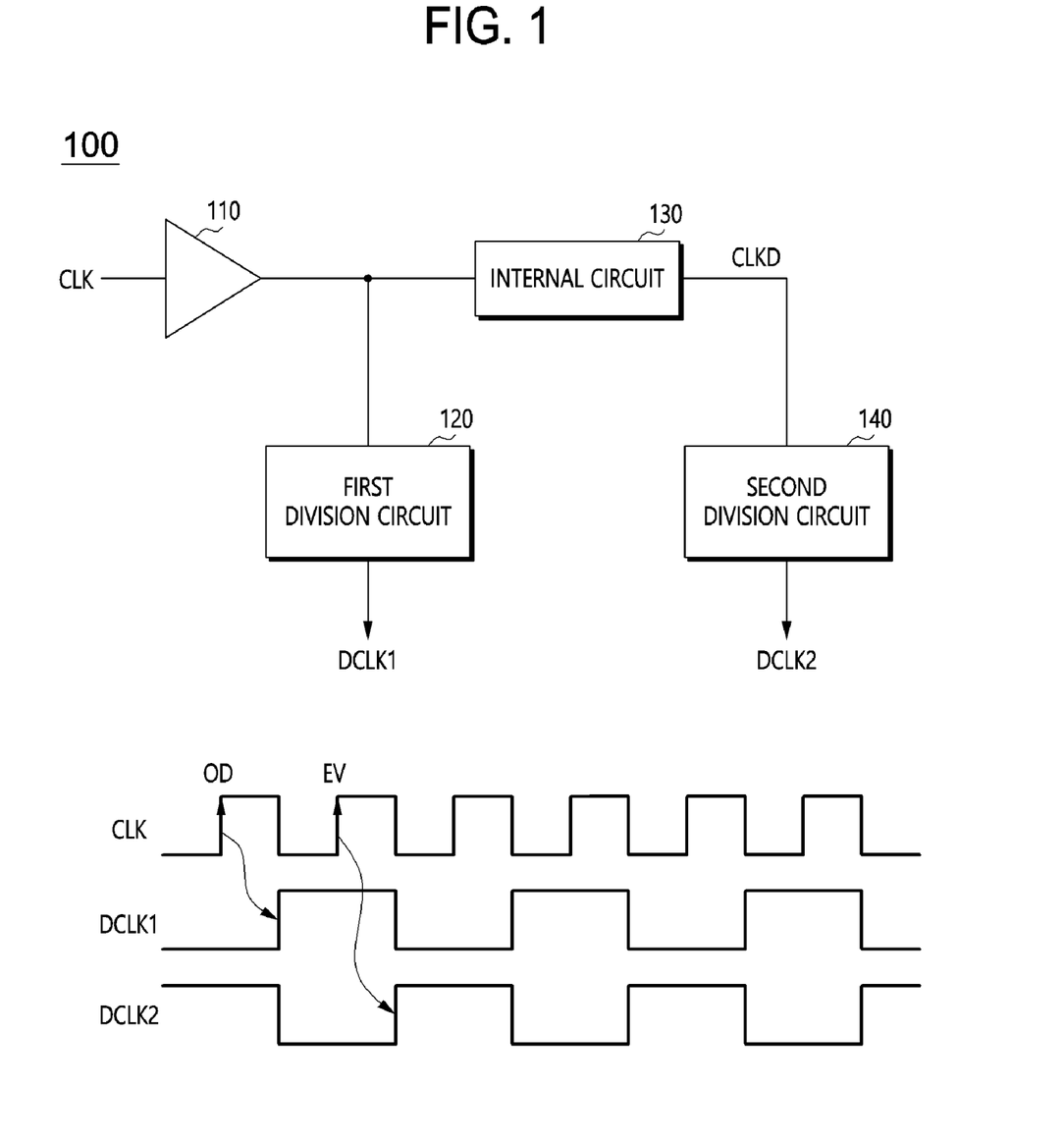
FIG. 1 is a diagram illustrating a configuration of a clock generating circuit in accordance with an embodiment of the present disclosure and an operation of the clock generating circuit.

FIG. 1 is a diagram illustrating a configuration of a clock generating circuit 100 in accordance with an embodiment of the present disclosure and an operation of the clock generating circuit 100. Referring to FIG. 1, the clock generating circuit 100 may include a clock buffer 110, a first division circuit 120, an internal circuit 130, and a second division circuit 140. The clock buffer 110 may receive a clock signal CLK and buffer the clock signal CLK. The first division circuit 120 may be connected to the clock buffer 110 and may receive the clock signal CLK through the clock buffer 110. The first division circuit 120 may generate a first internal clock signal DCLK1 by dividing the clock signal CLK. The first division circuit 120 may divide the frequency of the clock signal CLK by n and generate the first internal clock signal DCLK1 having a lower frequency than the clock signal CLK. Here, n may be an integer equal to or greater than 2. Hereinafter, a case in which n is 2 will be described. When n is 2, the frequency of the first internal clock signal DCLK1 may be ½ of the frequency of the clock signal CLK, and the wavelength of the first internal clock signal DCLK1 may be twice the wavelength of the clock signal CLK. The internal circuit 130 may be connected to the clock buffer 110 and may receive the clock signal CLK through the clock buffer 110. The internal circuit 130 may include any logic element, and the clock signal CLK may be delayed through the internal circuit 130. The internal circuit 130 may generate a delayed clock signal CLKD by delaying the clock signal CLK. The second division circuit 140 may be connected to the internal circuit 130 and may receive the delayed clock signal CLKD from the internal circuit 130. The second division circuit 140 may generate a second internal clock signal DCLK2 by dividing the delayed clock signal CLKD. The second division circuit 140 may divide the frequency of the delayed clock signal CLKD by n and generate the second internal clock signal DCLK2 having a lower frequency than the delayed clock signal CLKD. The frequency of the second internal clock signal DCLK2 may be ½ of the frequency of the delayed clock signal CLKD, and the wavelength of the second internal clock signal DCLK2 may be twice the wavelength of the delayed clock signal CLKD.

Because the first and second internal clock signals DCLK1 and DCLK2 are generated by dividing the clock signal CLK, the first and second internal clock signals DCLK1 and DCLK2 may be each generated in synchronization with an odd-numbered edge of the clock signal CLK or may be each generated in synchronization with an even-numbered edge of the clock signal CLK. Because the clock generating circuit 100 includes the first and second division circuits 120 and 140 disposed at different positions, operation timings of the first and second division circuits 120 and 140 may be different from each other. When the operation timings of the first and second division circuits 120 and 140 are different from each other, the first and second division circuits 120 and 140 may generate the first and second internal clock signals DCLK1 and DCLK2 in synchronization with edges with different sequence numbers, respectively. For example, the first internal clock signal DCLK1 may be generated in synchronization with an odd-numbered rising edge OD of the clock signal CLK, whereas the second internal clock signal DCLK2 may be generated in synchronization with an even-numbered rising edge EV of the clock signal CLK. When the first and second internal clock signals DCLK1 and DCLK2 are generated in synchronization with edges of difference sequence numbers of the clock signal CLK, characteristics of the first internal clock signal DCLK1 may be different from those of the second internal clock signal DCLK2.

Figure 2:
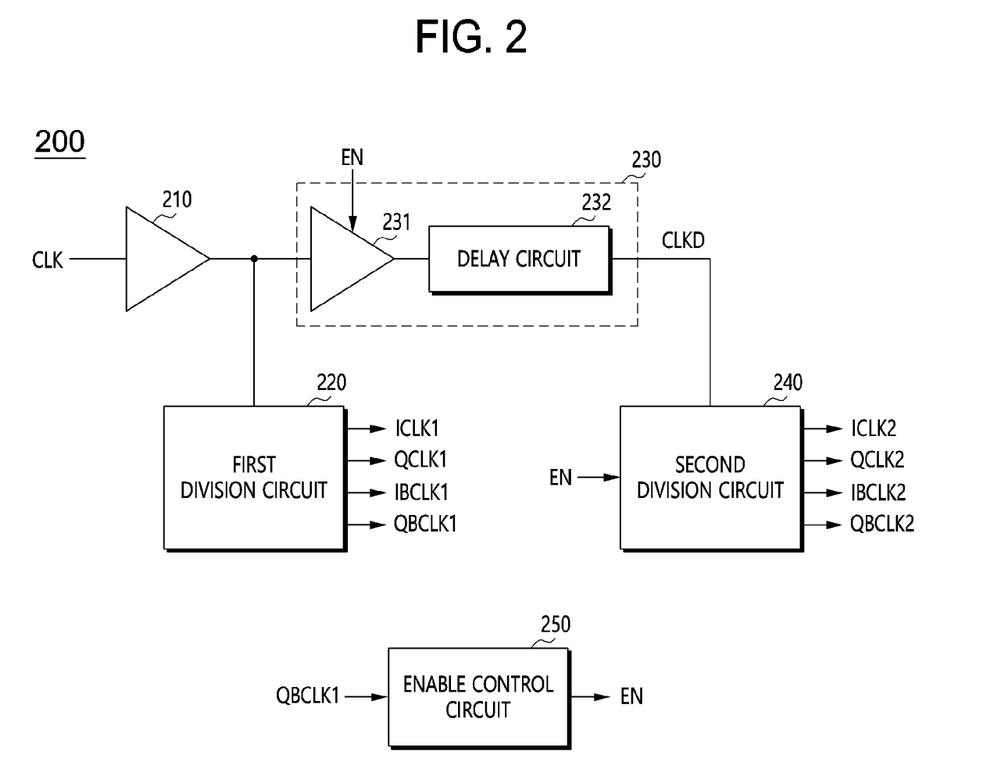
FIG. 2 is a diagram illustrating a configuration of a clock generating circuit in accordance with an embodiment of the present disclosure.

FIG. 2 is a diagram illustrating a configuration of a clock generating circuit 200 in accordance with an embodiment of the present disclosure. Referring to FIG. 2, the clock generating circuit 200 may receive a clock signal CLK and generate a first group of internal clock signals ICLK1, QCLK1, IBCLK1, and QBCLK1 and a second group of internal clock signals ICLK2, QCLK2, IBCLK2, and QBCLK2. The clock generating circuit 200 may include at least two division circuits disposed at different positions. Based on an internal clock signal generated from a division circuit that operates first, the clock generating circuit 200 may adjust the operation timing of a division circuit that operates later. The clock generating circuit 200 may generate the first group of internal clock signals ICLK1, QCLK1, IBCLK1, and QBCLK1 and the second group of internal clock signals ICLK2, QCLK2, IBCLK2, and QBCLK2 in synchronization with the edge with substantially the same sequence number of the clock signal CLK, thereby unifying the characteristics of the internal clock signals generated from the two division circuits.

The clock generating circuit 200 may include a clock buffer 210, a first division circuit 220, an internal circuit 230, a second division circuit 240, and an enable control circuit 250. The clock buffer 210 may receive the clock signal CLK and buffer the clock signal CLK. The first division circuit 220 may be connected to the clock buffer 210 and may receive the clock signal CLK outputted from the clock buffer 210. The first division circuit 220 may generate the first group of internal clock signals ICLK1, QCLK1, IBCLK1, and QBCLK1 by dividing the clock signal CLK. The first division circuit 220 may divide the frequency of the clock signal CLK by n, and generate the first group of internal clock signals ICLK1, QCLK1, IBCLK1, and QBCLK1, which each have a lower frequency than the clock signal CLK. Hereinafter, although a case in which n is 2 will be described, the division ratio of the first division circuit 220 may be variously changed. The frequencies of the first group of internal clock signals ICLK1, QCLK1, IBCLK1, and QBCLK1 may each be ½ of the frequency of the clock signal CLK, and the wavelengths of the first group of internal clock signals ICLK1, QCLK1, IBCLK1, and QBCLK1 may each be twice the wavelength of the clock signal CLK. The first group of internal clock signals ICLK1, QCLK1, IBCLK1, and QBCLK1 may include a first internal clock signal ICLK1, a second internal clock signal QCLK1, a third internal clock signal IBCLK1, and a fourth internal clock signal QBCLK1. The first internal clock signal ICLK1 may be a clock signal synchronized with a rising edge of the clock signal CLK and may be a reference clock signal of the first group of internal clock signals ICLK1, QCLK1, IBCLK1, and QBCLK1. The first to fourth internal clock signals ICLK1, QCLK1, IBCLK1, and QBCLK1 may sequentially have a phase difference of 90°. The second internal clock signal QCLK1 may have a phase delayed from the first internal clock signal ICLK1 by 90°, and the third internal clock signal IBCLK1 may have a phase delayed from the second internal clock signal QCLK1 by 90°, and the fourth internal clock signal QBCLK1 may have a phase delayed from the third internal clock signal IBCLK1 by 90°.

The internal circuit 230 may be connected to the clock buffer 210 and may receive the clock signal CLK through the clock buffer 210. The internal circuit 230 may include any logic circuit that forms a path through which the clock signal CLK propagates. The internal circuit 230 may generate a delayed clock signal CLKD by delaying the clock signal CLK. The operation timing of the internal circuit 230 may be determined based on one of the first group of internal clock signals ICLK1, QCLK1, IBCLK1, and QBCLK1 generated by the first division circuit 220. That is, the internal circuit 230 may be activated based on one of the first group of internal clock signals ICLK1, QCLK1, IBCLK1, and QBCLK1. The internal circuit 230 might not generate the delayed clock signal CLKD from the clock signal CLK when it is deactivated but may generate the delayed clock signal CLKD by delaying the clock signal CLK when it is activated. The internal circuit 230 may receive an enable signal EN and be activated based on the enable signal EN. When the enable signal EN is enabled, the internal circuit 230 may be activated and may generate the delayed clock signal CLKD by delaying the clock signal CLK. When the enable signal EN is in a disabled state, the internal circuit 230 may be deactivated and may substantially prevent the generation of the delayed clock signal CLKD.

The internal circuit 230 may include a buffer circuit 231 and a delay circuit 232. The buffer circuit 231 may be connected to the clock buffer 210 and may receive the clock signal CLK from the clock buffer 210. The buffer circuit 231 may receive the enable signal EN. The buffer circuit 231 may be selectively activated based on the enable signal EN. When the enable signal EN is enabled, the buffer circuit 231 may be activated and may buffer the clock signal CLK. When the enable signal EN is disabled, the buffer circuit 231 may be deactivated and might not buffer the clock signal CLK. The delay circuit 232 may be connected to the buffer circuit 231 and receive an output signal of the buffer circuit 231. The delay circuit 232 may generate the delayed clock signal CLKD by delaying the output signal of the buffer circuit 231. When the enable signal EN is enabled, the buffer circuit 231 may buffer the clock signal CLK and the delay circuit 232 may generate the delayed clock signal CLKD by delaying the output signal of the buffer circuit 231. When the enable signal EN is disabled, the buffer circuit 231 may substantially prevent the clock signal CLK from being outputted to the delay circuit 232, and the delay circuit 232 might not generate the delayed clock signal CLKD.

The second division circuit 240 may be connected to the internal circuit 230 and may receive the delayed clock signal CLKD from the internal circuit 230. The second division circuit 240 may generate the second group of internal clock signals ICLK2, QCLK2, IBCLK2, and QBCLK2 by dividing the delayed clock signal CLKD. The second division circuit 240 may divide the frequency of the delayed clock signal CLKD by n and generate the second group of internal clock signals ICLK2, QCLK2, IBCLK2, and QBCLK2, which each have a lower frequency than the delayed clock signal CLKD. The division ratio of the second division circuit 240 may be substantially the same as that of the first division circuit 220. The frequencies of the second group of internal clock signals ICLK2, QCLK2, IBCLK2, and QBCLK2 may each be ½ of the frequency of the delayed clock signal CLKD, and the wavelengths of the second group of internal clock signals ICLK2, QCLK2, IBCLK2, and QBCLK2 may each be twice the wavelength of the delayed clock signal CLKD. The second group of internal clock signals ICLK2, QCLK2, IBCLK2, and QBCLK2 may include a first internal clock signal ICLK2, a second internal clock signal QCLK2, a third internal clock signal IBCLK2, and a fourth internal clock signal QBCLK2. The first internal clock signal ICLK2 may be a clock signal synchronized with a rising edge of the delayed clock signal CLKD and may be a reference clock signal of the second group of internal clock signals ICLK2, QCLK2, IBCLK2, and QBCLK2. The first to fourth internal clock signals ICLK2, QCLK2, IBCLK2, and QBCLK2 may sequentially have a phase difference of 90°. The second internal clock signal QCLK2 may have a phase delayed from the first internal clock signal ICLK2 by 90°, the third internal clock signal IBCLK2 may have a phase delayed from the second internal clock signal QCLK2 by 90°, and the fourth internal clock signal QBCLK2 may have a phase delayed from the third internal clock signal IBCLK2 by 90° In an embodiment, the operation timing of the second division circuit 240 may be determined based on the first group of internal clock signals ICLK1, QCLK1, IBCLK1, and QBCLK1. The second division circuit 240 may further receive the enable signal EN. The second division circuit 240 may be activated when the enable signal EN is enabled and may be deactivated when the enable signal EN is in a disabled state.

The enable control circuit 250 may receive the first group of internal clock signals ICLK1, QCLK1, IBCLK1, and QBCLK1 from the first division circuit 220. The enable control circuit 250 may generate the enable signal EN from one of the first group of internal clock signals ICLK1, QCLK1, IBCLK1, and QBCLK1. The enable control circuit 250 may generate the enable signal EN based on an internal clock signal having the most lagging phase among the first group of internal clock signals ICLK1, QCLK1, IBCLK1, and QBCLK1. The internal clock signal having the most lagging phase among the first group of internal clock signals ICLK1, QCLK1, IBCLK1, and QBCLK1 may be the fourth internal clock signal QBCLK1, and the enable control circuit 250 may generate the enable signal EN based on the fourth internal clock signal QBCLK1. For example, when a rising edge of the fourth internal clock signal QBCLK1 is generated (that is, the logic level of the fourth internal clock signal QBCLK1 changes from a low logic level to a high logic level), the enable control circuit 250 may enable the enable signal EN.

Figure 3:
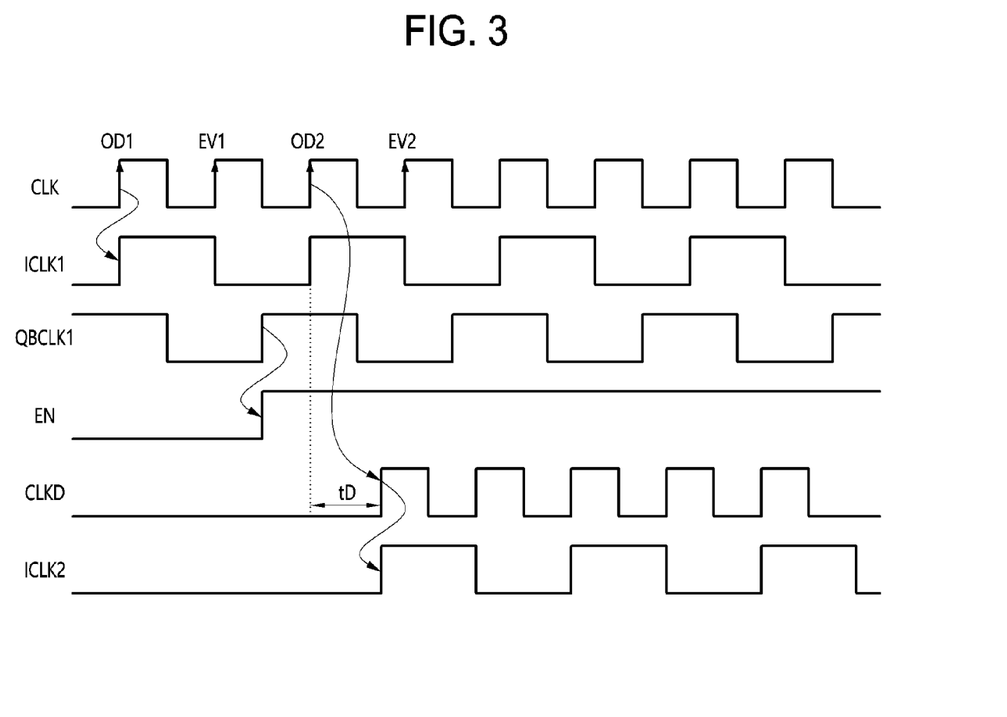
FIG. 3 is a timing diagram illustrating an operation of the clock generating circuit illustrated in FIG. 2.

FIG. 3 is a timing diagram illustrating the operation of the clock generating circuit 200 illustrated in FIG. 2. The operation of the clock generating circuit 200 in accordance with an embodiment of the present disclosure will be described as follows with reference to FIG. 2 and FIG. 3. FIG. 3 illustrates a case in which the first internal clock signal generated by the first division circuit is synchronized with an odd-numbered rising edge. The first division circuit 220 may receive the clock signal CLK and generate the first group of internal clock signals ICLK1, QCLK1, IBCLK1, and QBCLK1 based on the clock signal CLK. The enable signal EN may be in a disabled state, and the buffer circuit 231 of the internal circuit 230 might not provide the clock signal CLK to the delay circuit 232. The first division circuit 220 may generate the rising edge of the first internal clock signal ICLK1 in synchronization with a first odd rising edge OD1 of the clock signal CLK. The fourth internal clock signal QBCLK1 may have a phase difference from the first internal clock signal ICLK1 by 270°. The enable control circuit 250 may enable the enable signal EN when a rising edge of the fourth internal clock signal QBCLK1 is generated. When the enable signal EN is enabled, the buffer circuit 231 may be activated and may provide the clock signal CLK to the delay circuit 232. The delay circuit 232 may generate the delayed clock signal CLKD by delaying the clock signal CLK. The clock signal CLK might not be provided to the internal circuit 230 and the second division circuit 240 until the enable signal EN is enabled. Accordingly, the first odd rising edge OD1 and a first even rising edge EV1 of the clock signal CLK might not be provided to the delay circuit 232. When the enable signal EN is enabled, a second odd rising edge OD2 of the clock signal CLK may start to be provided to the delay circuit 232 through the buffer circuit 231, and the delay circuit 232 may generate the delayed clock signal CLKD by delaying the clock signal CLK. A first rising edge of the delayed clock signal CLKD may be generated after a delay time tD of the delay circuit 232 from the time when the second odd rising edge OD2 of the clock signal CLK is generated.

The second division circuit 240 may generate the second group of internal clock signals ICLK2, QCLK2, IBCLK2, and QBCLK2 based on the delayed clock signal CLKD. The second division circuit 240 may generate a first rising edge of the first internal clock signal ICLK2 in synchronization with a first rising edge of the delayed clock signal CLKD. Accordingly, both the first internal clock signal ICLK1 of the first group of internal clock signals ICLK1, QCLK1, IBCLK1, and QBCLK1 and the first internal clock signal ICLK2 of the second group of internal clock signals ICLK2, QCLK2, IBCLK2, and QBCLK2 may be generated in synchronization with the odd-numbered rising edge of the clock signal CLK, and the sequence number of the edge of the clock signal CLK, with which the first group of internal clock signals ICLK1, QCLK1, IBCLK1, and QBCLK1 generated by the first division circuit 220 are synchronized, may be substantially the same as that of the edge of the clock signal CLK with which the second group of internal clock signals ICLK2, QCLK2, IBCLK2, and QBCLK2 generated by the second division circuit 240 are synchronized. Accordingly, the first group of internal clock signals ICLK1, QCLK1, IBCLK1, and QBCLK1 may only have a fixed phase difference from the second group of internal clock signals ICLK2, QCLK2, IBCLK2, and QBCLK2 (that is, a phase difference corresponding to the delay time tD of the delay circuit 232), and the first group of internal clock signals ICLK1, QCLK1, IBCLK1, and QBCLK1 and the second group of internal clock signals ICLK2, QCLK2, IBCLK2, and QBCLK2 may have substantially the same characteristics.

Figure 4:
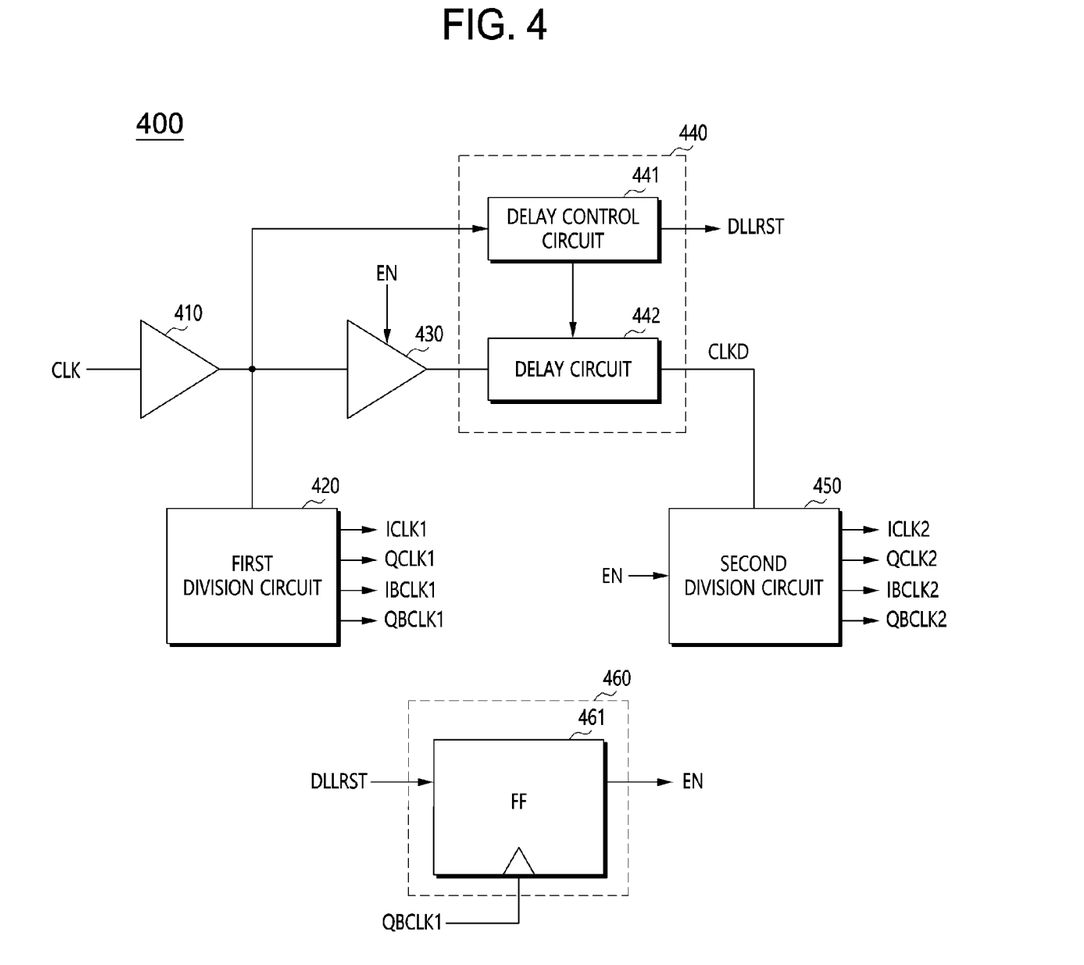
FIG. 4 is a diagram illustrating a configuration of a clock generating circuit in accordance with an embodiment of the present disclosure.

FIG. 4 is a diagram illustrating the configuration of a clock generating circuit 400 in accordance with an embodiment of the present disclosure. Referring to FIG. 4, the clock generating circuit 400 may include a clock buffer 410, a first division circuit 420, a buffer circuit 430, a delay locked loop circuit 440, a second division circuit 450, and an enable control circuit 460. The clock buffer 410 may receive a clock signal CLK and buffer the clock signal CLK. The first division circuit 420 may be connected to the clock buffer 410 and may receive the clock signal CLK through the clock buffer 410. The first division circuit 420 may generate a first group of internal clock signals ICLK1, QCLK1, IBCLK1, and QBCLK1 by dividing the clock signal CLK. The first division circuit 420 may divide the frequency of the clock signal CLK and generate the first group of internal clock signals ICLK1, QCLK1, IBCLK1, and QBCLK1, which each have a lower frequency than the clock signal CLK. The first group of internal clock signals may include first to fourth internal clock signals ICLK1, QCLK1, IBCLK1, and QBCLK1, and the first to fourth internal clock signals ICLK1, QCLK1, IBCLK1, and QBCLK1 may sequentially have a phase difference of 90°.

The buffer circuit 430 may be connected to the clock buffer 410 and may receive the clock signal CLK through the clock buffer 410. The buffer circuit 430 may buffer the clock signal CLK. The buffer circuit 430 may receive the enable signal EN and may be selectively activated based on the enable signal EN. The buffer circuit 430 may be activated when the enable signal EN is enabled and may buffer the clock signal CLK. The buffer circuit 430 may be deactivated when the enable signal EN is disabled.

The delay locked loop circuit 440 may be connected to the buffer circuit 430 and may receive an output signal of the buffer circuit 430. The delay locked loop circuit 440 may generate a delayed clock signal CLKD by performing a delay locked operation on the output signal of the buffer circuit 430. The delay locked loop circuit 440 may perform the delay locked operation by delaying the output signal of the buffer circuit 430 by a time obtained by subtracting a modeled delay time from an integer multiple of a cycle of the clock signal CLK. The delay locked loop circuit 440 may be initialized and/or activated based on a delay locked loop reset signal DLLRST. The delay locked loop circuit 440 may detect the input of the clock signal CLK to generate the delay locked loop reset signal DLLRST.

The delay locked loop circuit 440 may include a delay control circuit 441 and a delay circuit 442. The delay control circuit 441 may receive the clock signal CLK from the clock buffer 410. The delay control circuit 441 may generate the delay locked loop reset signal DLLRST based on the clock signal CLK and initialize the delay time of the delay circuit 442. When the delay locked operation of the delay locked loop circuit 440 is performed, the delay control circuit 441 may variously change the delay time of the delay circuit 442. The delay circuit 442 may be connected to the buffer circuit 430 and may receive the output signal of the buffer circuit 430. The delay circuit 442 may generate the delayed clock signal CLKD by delaying the output signal of the buffer circuit 430 by a delay time set by the delay control circuit 441. The delay control circuit 441 may provide the delay locked loop reset signal DLLRST to the enable control circuit 460.

The second division circuit 450 may be connected to the delay locked loop circuit 440 and may receive the delayed clock signal CLKD from the delay locked loop circuit 440. The second division circuit 450 may generate a second group of internal clock signals ICLK2, QCLK2, IBCLK2, and QBCLK2 by dividing the delayed clock signal CLKD. The second division circuit 450 may divide the frequency of the delayed clock signal CLKD and generate the second group of internal clock signals ICLK2, QCLK2, IBCLK2, and QBCLK2, which each have a lower frequency than the delayed clock signal CLKD. The second group of internal clock signals may include first to fourth internal clock signals ICLK2, QCLK2, IBCLK2, and QBCLK2 and the first to fourth internal clock signals ICLK2, QCLK2, IBCLK2, and QBCLK2 may sequentially have a phase difference of 90°. The second division circuit 450 may further receive the enable signal EN. The second division circuit 450 may be selectively activated based on the enable signal EN. The second division circuit 450 may substantially maintain a deactivated state when the enable signal EN is in a disabled state and may be activated when the enable signal EN is enabled.

The enable control circuit 460 may receive the first group of internal clock signals ICLK1, QCLK1, IBCLK1, and QBCLK1 and the delay locked loop reset signal DLLRST. The enable control circuit 460 may generate the enable signal EN based on the delay locked loop reset signal DLLRST and one of the first group of internal clock signals ICLK1, QCLK1, IBCLK1, and QBCLK1. One of the first group of internal clock signals ICLK1, QCLK1, IBCLK1, and QBCLK1 may be an internal clock signal having the most lagging phase among the first group of internal clock signals ICLK1, QCLK1, IBCLK1, and QBCLK1. The one internal clock signal with the most lagging phase may be the fourth internal clock signal QBCLK1. The enable control circuit 460 may output the delay locked loop reset signal DLLRST as the enable signal EN in synchronization with the fourth internal clock signal QBCLK1. The enable control circuit 460 might not enable the enable signal EN even though the delay locked loop reset signal DLLRST is enabled and may enable the enable signal EN when a rising edge of the fourth internal clock signal QBCLK1 is generated. The enable control circuit 460 may include a flip-flop 461. The flip-flop 461 may be a D flip-flop. The flip-flop 461 may receive the delay locked loop reset signal DLLRST through an input terminal thereof, receive the fourth internal clock signal QBCLK1 through a clock terminal thereof, and output the enable signal EN through an output terminal thereof.

Figure 5:
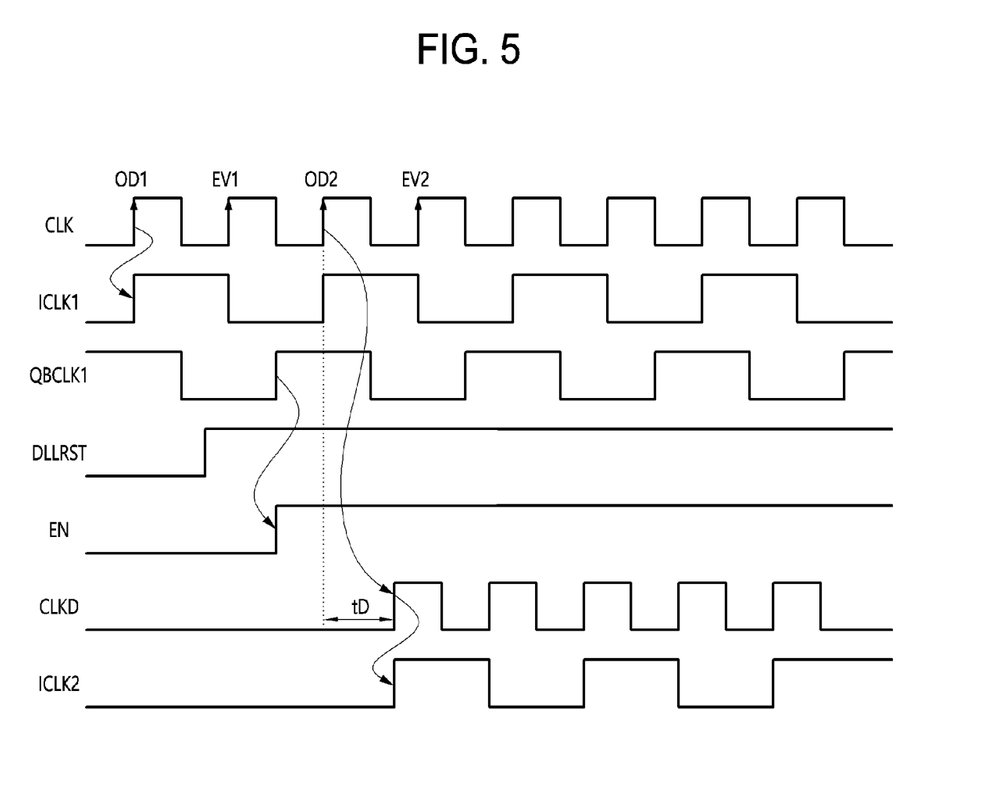
FIG. 5 is a timing diagram illustrating an operation of the clock generating circuit illustrated in FIG. 4.

FIG. 5 is a timing diagram illustrating the operation of the clock generating circuit 400 illustrated in FIG. 4. The operation of the clock generating circuit 400 in accordance with an embodiment of the present disclosure will be described as follows with reference to FIG. 4 and FIG. 5. When the clock generating circuit 400 receives the clock signal CLK, the clock buffer 410 may provide the clock signal CLK to the first division circuit 420, the buffer circuit 430, and the delay locked loop circuit 440. The first division circuit 420 may generate the first group of internal clock signals ICLK1, QCLK1, IBCLK1, and QBCLK1 by dividing the frequency of the clock signal CLK. The enable signal EN may be in a disabled state, and the buffer circuit 430 might not provide the clock signal CLK to the delay circuit 442 of the delay locked loop circuit 440. The second division circuit 450 may also maintain a deactivated state. The first division circuit 420 may generate a rising edge of the first internal clock signal ICLK1 in synchronization with a first odd rising edge OD1 of the clock signal CLK. The fourth internal clock signal QBCLK1 may have a phase difference from the first internal clock signal ICLK1 of 270°.

The delay control circuit 441 of the delay locked loop circuit 440 may generate the delay locked loop reset signal DLLRST upon receiving the clock signal CLK from the clock buffer 430. The delay control circuit 441 may provide the delay locked loop reset signal DLLRST to the enable control circuit 460. The enable control circuit 460 may allow the enable signal EN to substantially maintain a disabled state until a rising edge of the fourth internal clock signal QBCLK1 is generated even though the delay locked loop reset signal DLLRST is enabled. When the enable signal EN is in a disabled state, the buffer circuit 430 might not provide the clock signal CLK to the delay circuit 442 and the delayed clock signal CLKD may also not be generated.

The enable control circuit 460 may enable the enable signal EN when the rising edge of the fourth internal clock signal QBCLK1 is generated. When the enable signal EN is enabled, the buffer circuit 430 may be activated and the buffer circuit 430 may provide the clock signal CLK to the delay circuit 442. The delay circuit 442 may generate the delayed clock signal CLKD by delaying the output signal of the buffer circuit 430. Because the clock signal CLK is not provided to the delay circuit 442 until the enable signal EN is enabled, the first odd rising edge OD1 and a first even rising edge EV1 of the clock signal CLK might not be provided to the delay circuit 442. When the enable signal EN is enabled, a second odd rising edge OD2 of the clock signal CLK may start to be provided to the delay circuit 442 through the buffer circuit 430, and the delay circuit 442 may generate the delayed clock signal CLKD by delaying the clock signal CLK. A first rising edge of the delayed clock signal CLKD may be generated after a delay time tD of the delay circuit 442 from the time when the second odd rising edge OD2 of the clock signal CLK is generated.

The second division circuit 450 may generate the second group of internal clock signals ICLK2, QCLK2, IBCLK2, and QBCLK2 based on the delayed clock signal CLKD. The second division circuit 450 may generate a first rising edge of the first internal clock signal ICLK2 in synchronization with the first rising edge of the delayed clock signal CLKD. Accordingly, both the first internal clock signal ICLK1 of the first group of internal clock signals ICLK1, QCLK1, IBCLK1, and QBCLK1 and the first internal clock signal ICLK2 of the second group of internal clock signals ICLK2, QCLK2, IBCLK2, and QBCLK2 may be generated in synchronization with an odd-numbered rising edge of the clock signal CLK, and the sequence number of the edge of the clock signal CLK, with which the first group of internal clock signals ICLK1, QCLK1, IBCLK1, and QBCLK1 generated by the first division circuit 420 are synchronized, may be substantially the same as that of the edge of the clock signal CLK with which the second group of internal clock signals ICLK2, QCLK2, IBCLK2, and QBCLK2 generated by the second division circuit 450 are synchronized. Accordingly, the first group of internal clock signals ICLK1, QCLK1, IBCLK1, and QBCLK1 may only have a fixed phase difference from the second group of internal clock signals ICLK2, QCLK2, IBCLK2, and QBCLK2 (that is, a phase difference corresponding to the delay time tD of the delay circuit 442), and the first group of internal clock signals ICLK1, QCLK1, IBCLK1, and QBCLK1 and the second group of internal clock signals ICLK2, QCLK2, IBCLK2, and QBCLK2 may have substantially the same characteristics.

Figure 6:
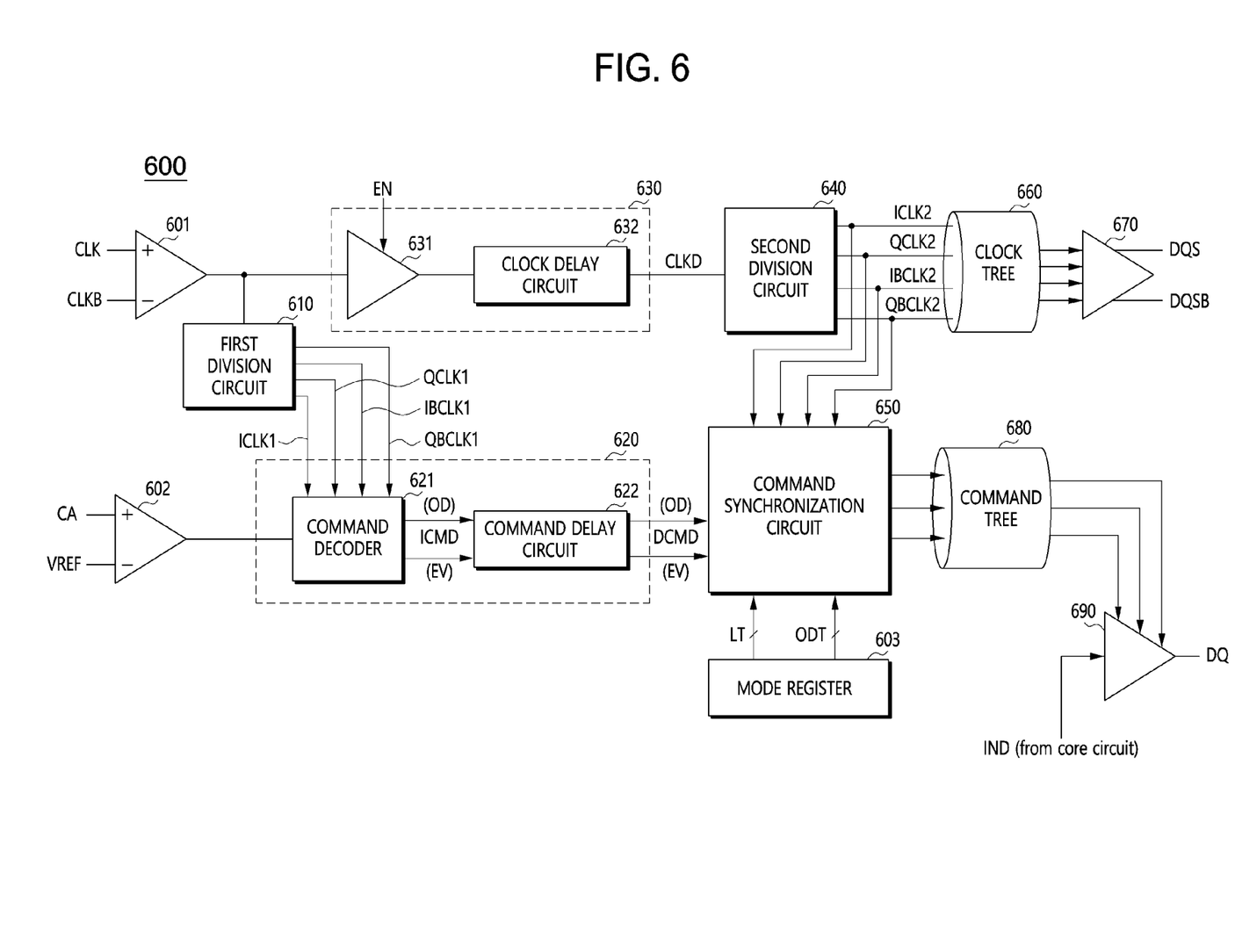
FIG. 6 is a diagram illustrating a configuration of a semiconductor apparatus in accordance with an embodiment of the present disclosure.

FIG. 6 is a diagram illustrating a configuration of a semiconductor apparatus 600 in accordance with an embodiment of the present disclosure. Referring to FIG. 6, the semiconductor apparatus 600 may include a clock buffer 601, a first division circuit 610, a command buffer 602, a command path circuit 620, a clock path circuit 630, a second division circuit 640, and a command synchronization circuit 650. The clock buffer 601 may receive a clock signal CLK and buffer the clock signal CLK. The clock signal CLK may be inputted as a differential signal together with a complementary clock signal CLKB. The clock signal CLK and the complementary clock signal CLKB may be system clock signals provided from the outside of the semiconductor apparatus 600. The clock buffer 601 may receive the clock signal CLK by differentially amplifying the clock signal CLK and the complementary clock signal CLKB. The first division circuit 610 may receive the clock signal CLK from the clock buffer 601 and generate a first group of internal clock signals ICLK1, QCLK1, IBCLK1, and QBCLK1 by dividing the clock signal CLK. The first division circuit 610 may divide the frequency of the clock signal CLK and generate the first group of internal clock signals ICLK1, QCLK1, IBCLK1, and QBCLK1, which each have a lower frequency than the clock signal CLK. The first group of internal clock signals may include first to fourth internal clock signals ICLK1, QCLK1, IBCLK1, and QBCLK1, and the first to fourth internal clock signals ICLK1, QCLK1, IBCLK1, and QBCLK1 may sequentially have a phase difference of 90°. In an embodiment, the clock buffer 601 may provide the complementary clock signal CLKB together with the clock signal CLK, and the first division circuit 610 may generate the first group of internal clock signals ICLK1, QCLK1, IBCLK1, and QBCLK1 by using both the clock signal CLK and the complementary clock signal CLKB.

The command buffer 602 may receive a command signal CA. The command signal CA may be a control signal provided from the outside of the semiconductor apparatus 600 so that the semiconductor apparatus 600 may perform various operations. For example, the semiconductor apparatus 600 may perform various operations, such as an active operation, a precharge operation, a target read operation, a target write operation, a non-target read operation, a non-target write operation, and a refresh operation, based on the command signal CA. The command buffer 602 may receive the command signal CA by using a reference voltage VREF. The reference voltage VREF may have a voltage level corresponding to an intermediate level between a maximum voltage level and a minimum voltage level of the command signal CA. The command buffer 602 may receive the command signal CA by differentially amplifying the command signal CA and the reference voltage VREF. The command buffer 602 may provide the command signal CA to the command path circuit 620.

The command path circuit 620 may receive the command signal CA and the first group of internal clock signals ICLK1, QCLK1, IBCLK1, and QBCLK1, and generate a delay command signal DCMD based on the command signal CA and the first group of internal clock signals ICLK1, QCLK1, IBCLK1, and QBCLK1. The command path circuit 620 may generate an internal command signal ICMD by synchronizing the command signal CA with at least one of the first group of internal clock signals ICLK1, QCLK1, IBCLK1, and QBCLK1, and generate the delayed command signal DCMD by delaying the internal command signal ICMD. For example, the command path circuit 620 may generate the internal command signal ICMD by synchronizing the command signal CA with the first internal clock signal ICLK1. The command path circuit 620 may latch the command signal CA in synchronization with the first internal clock signal ICLK1 and generate the internal command signal ICMD by decoding the latched command signal. The command path circuit 620 may generate the delayed command signal DCMD by delaying the internal command signal ICMD. In an embodiment, the command path circuit 620 may generate the internal command signal ICMD by synchronizing the command signal CA with the second internal clock signal QCLK1 instead of the first internal clock signal ICLK1. In an embodiment, the command path circuit 620 may generate the internal command signal ICMD by synchronizing the command signal CA with at least two of the first group of internal clock signals ICLK1, QCLK1, IBCLK1, and QBCLK1. For example, when the command signal CA is transmitted in synchronization with an odd-numbered edge of the clock signal CLK, the command path circuit 620 may latch the command signal CA in synchronization with the first internal clock signal ICLK1 or the second internal clock signal QCLK1 and generate an internal odd command signal ICMD (OD) by decoding the latched command signal. When the command signal CA is transmitted in synchronization with an even-numbered edge of the clock signal CLK, the command path circuit 620 may latch the command signal CA in synchronization with the third internal clock signal IBCLK1 or the fourth internal clock signal QBCLK1 and generate an internal even command signal ICMD (EV) by decoding the latched command signal. The command path circuit 620 may generate a delayed odd command signal DCMD (OD) or a delayed even command signal DCMD (EV) by delaying the internal odd command signal ICMD (OD) or the internal even command signal ICMD (EV).

The command path circuit 620 may include a command decoder 621 and a command delay circuit 622. The command decoder 621 may be connected to the command buffer 602 and may receive the command signal CA from the command buffer 602. The command decoder 621 may receive the first group of internal clock signals ICLK1, QCLK1, IBCLK1, and QBCLK1 from the first division circuit 610. The command decoder 621 may latch the command signal CA by synchronizing the command signal CA based on at least one of the first group of internal clock signals ICLK1, QCLK1, IBCLK1, and QBCLK1. The command decoder 621 may generate the internal command signal ICMD by decoding the latched command signal. The command decoder 621 may provide the internal command signal ICMD to the command delay circuit 622. The command delay circuit 622 may receive the internal command signal ICMD from the command decoder 621 and generate the delayed command signal DCMD by delaying the internal command signal ICMD.

The clock path circuit 630 may be connected to the clock buffer 601 and may receive the clock signal CLK from the clock buffer 601. The clock path circuit 630 may perform a delay locked operation on the clock signal CLK and generate the delayed clock signal CLKD by delaying the clock signal. The clock path circuit 630 may be activated based on at least one of the first group of internal clock signals ICLK1, QCLK1, IBCLK1, and QBCLK1. The clock path circuit 630 may be activated in synchronization with an internal clock signal having the most lagging phase among the first group of internal clock signals ICLK1, QCLK1, IBCLK1, and QBCLK1. The clock path circuit 630 may receive an enable signal EN. The clock path circuit 630 may be selectively activated according to whether the enable signal EN is enabled. When the clock path circuit 630 is activated based on the enable signal EN, the clock path circuit 630 may generate the delayed clock signal CLKD by delaying the clock signal CLK. Although not illustrated in the drawing, the semiconductor apparatus 600 may further include an enable control circuit that generates the enable signal EN based on the fourth internal clock signal QBCLK1 having the most lagging phase among the first group of internal clock signals ICLK1, QCLK1, IBCLK1, and QBCLK1. The semiconductor apparatus 600 may include one of the enable control circuits 250 and 460 illustrated in FIG. 2 and FIG. 4.

The clock path circuit 630 may include a buffer circuit 631 and a clock delay circuit 632. The buffer circuit 631 may receive the clock signal CLK and the enable signal EN. The buffer circuit 631 may be activated when the enable signal EN is enabled and may buffer the clock signal CLK. The buffer circuit 631 may be deactivated when the enable signal EN is disabled and may substantially prevent the clock signal CLK from being provided to the clock delay circuit 632. The clock delay circuit 632 may be connected to the buffer circuit 631 and may receive an output signal of the buffer circuit 631. The clock delay circuit 632 may generate the delayed clock signal CLKD by delaying the output signal of the buffer circuit 631. The clock delay circuit 632 may be a delay locked loop circuit that performs a delay locked operation on the clock signal CLK. The buffer circuit 430 and the delay locked loop circuit 440 illustrated in FIG. 4 may be applied as the clock path circuit 630. A delay time of the command delay circuit 622 may be substantially the same as that of the clock delay circuit 632. The delay time of the command delay circuit 622 may be changed according to a change in the delay time of the clock delay circuit 632.

The second division circuit 640 may be connected to the clock path circuit 630 and may receive the delayed clock signal CLKD from the clock path circuit 630. The second division circuit 640 may generate a second group of internal clock signals ICLK2, QCLK2, IBCLK2, and QBCLK2 by dividing the delayed clock signal CLKD. The second division circuit 640 may divide the frequency of the delayed clock signal CLKD and generate the second group of internal clock signals ICLK2, QCLK2, IBCLK2, and QBCLK2, which each have a lower frequency than the delayed clock signal CLKD. The second group of internal clock signals may include first to fourth internal clock signals ICLK2, QCLK2, IBCLK2, and QBCLK2, and the first to fourth internal clock signals ICLK2, QCLK2, IBCLK2, and QBCLK2 may sequentially have a phase difference of 90°, In an embodiment, the second division circuit 640 may be selectively activated based on one of the first group of internal clock signals ICLK1, QCLK1, IBCLK1, and QBCLK1. The second division circuit 640 may be selectively activated based on an internal clock signal having the most lagging phase among the first group of internal clock signals ICLK1, QCLK1, IBCLK1, and QBCLK1. The second division circuit 640 may further receive the enable signal EN. The second division circuit 640 may be selectively activated according to whether the enable signal EN is enabled. The second division circuit 640 may be activated when the enable signal EN is enabled and may generate the second group of internal clock signals ICLK2, QCLK2, IBCLK2, and QBCLK2 by dividing the delayed clock signal CLKD. The second division circuit 640 may be deactivated when the enable signal EN is disabled and might not generate the second group of internal clock signals ICLK2, QCLK2, IBCLK2, and QBCLK2 from the delayed clock signal CLKD.

The command synchronization circuit 650 may receive the delay command signal DCMD from the command delay circuit 620 and receive the second group of internal clock signals ICLK2, QCLK2, IBCLK2, and QBCLK2 from the second division circuit 640. The command synchronization circuit 650 may generate an internal control signal IODT by synchronizing the delayed command signal DCMD with at least one of the second group of internal clock signals ICLK2, QCLK2, IBCLK2, and QBCLK2. For example, the command synchronization circuit 650 may generate the internal control signal IODT by synchronizing the delayed command signal DCMD with the first internal clock signal ICLK2. In an embodiment, the command synchronization circuit 650 may generate the internal control signal IODT by synchronizing the delayed command signal DCMD with the second internal clock signal QCLK2 instead of the first internal clock signal ICLK2. In an embodiment, the command synchronization circuit 650 may generate the internal control signal IODT by synchronizing the delayed command signal DCMD with two or more of the second group of internal clock signals ICLK2, QCLK2, IBCLK2, and QBCLK2. For example, the command synchronization circuit 650 may generate the internal control signal IODT by synchronizing the delayed odd command signal DCMD (OD) with the first internal clock signal ICLK2 or the second internal clock signal QCLK2. The command synchronization circuit 650 may generate the internal control signal IODT by synchronizing the delayed even command signal DCMD (EV) with the third internal clock signal IBCLK2 or the fourth internal clock signal QBCLK2.

The command synchronization circuit 650 may further receive latency information LT and impedance information ODT. The semiconductor apparatus 600 may further include a mode register 603, and the mode register 603 may provide the latency information LT and the impedance information ODT to the command synchronization circuit 650. The mode register 603 may store various parameters related to the operation of the semiconductor apparatus 600. Each of the latency information LT and the impedance information ODT may be one of the various parameters. The latency information LT may mean a delay time until the command signal CA is received by the semiconductor apparatus 600 and then the semiconductor apparatus 600 performs an operation corresponding to the command signal CA. The latency information LT may be defined as an integer multiple of the clock signal CLK. The impedance information ODT may include information for setting an impedance of a data circuit included in the semiconductor apparatus 600 during a read and/or write operation. For example, the data circuit may include a data transmission circuit and a data receiving circuit, and an impedance of the data transmission circuit may be set according to the impedance information ODT during the read and write operations, so that a transmission impedance and a receiving impedance of the data circuit may be set. The transmission impedance may mean an impedance value of the data transmission circuit that is set when the data circuit outputs data through the data transmission circuit. The receiving impedance may mean an impedance value of the data transmission circuit that is set when the data circuit receives the data through the data receiving circuit. Furthermore, when another semiconductor apparatus or another data circuit transmits and receives data, the semiconductor apparatus 600 may perform a non-target read operation or a non-target write operation and provide a transmission impedance and a receiving impedance for a read and write operation of the another semiconductor apparatus or the another data circuit, and the impedance of the data transmission circuit may be set according to the impedance information ODT during the non-target read operation or the non-target write operation.

When the command signal CA received by the semiconductor apparatus 600 includes information instructing a read and/or write operation, the command synchronization circuit 650 may enable the internal control signal IODT by delaying the delay command signal DCMD by a time corresponding to the latency information LT in synchronization with at least one of the second group of internal clock signals ICLK2, QCLK2, IBCLK2, and QBCLK2, and output the impedance information ODT in a period in which the internal control signal IODT is enabled. The command synchronization circuit 650 may synchronize the delayed command signal DCMD, which is synchronized with the first group of internal clock signals ICLK1, QCLK1, IBCLK1, and QBCLK1 and delayed through the command path circuit 620, with the second group of internal clock signals ICLK2, QCLK2, IBCLK2, and QBCLK2 delayed through the clock path circuit 630, thereby converting the delayed command signal DCMD into from the domain of the clock signal CLK to the domain of the second group of internal clock signals ICLK2, QCLK2, IBCLK2, and QBCLK2.

The semiconductor apparatus 600 may further include a clock tree 660, a strobe transmission circuit 670, a command tree 680, and a data transmission circuit 690. The clock tree 660 may receive the second group of internal clock signals ICLK2, QCLK2, IBCLK2, and QBCLK2, and distribute the second group of internal clock signals ICLK2, QCLK2, IBCLK2, and QBCLK2 into a plurality of strobe transmission circuits. The strobe transmission circuit 670 may receive the second group of internal clock signals ICLK2, QCLK2, IBCLK2, and QBCLK2 from the clock tree 660, and generate a data strobe signal pair DQS and DQSB from the second group of internal clock signals ICLK2, QCLK2, IBCLK2, and QBCLK2. The strobe transmission circuit 670 may output the data strobe signal pair DQS and DQSB to the outside of the semiconductor apparatus 600. The command tree 680 may receive the internal control signal IODT from the command synchronization circuit 650. The command tree 680 may distribute the internal control signal IODT to a plurality of data transmission circuits. The data transmission circuit 690 may receive the internal control signal IODT from the command tree 680. The impedance of the data transmission circuit 690 may be set based on the internal control signal IODT, and the data transmission circuit 690 may transmit, as data DQ, internal data IND provided from a core circuit to the outside of the semiconductor apparatus 600. The data strobe signal pair DQS and DQSB outputted from the strobe transmission circuit 670 and the data DQ outputted from the data transmission circuit 690 may be synchronized with each other.

Figure 7:
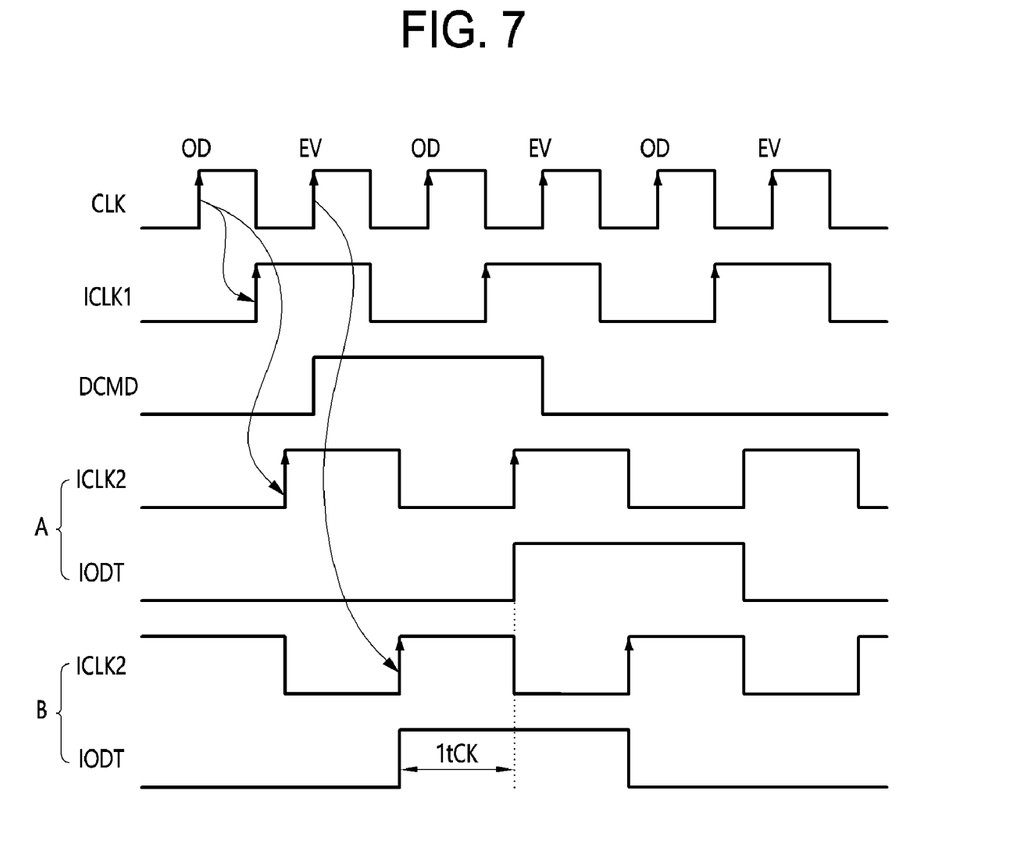
FIG. 7 is a timing diagram illustrating an operation of the semiconductor apparatus illustrated in FIG. 6.

FIG. 7 is a timing diagram illustrating the operation of the semiconductor apparatus 600 in accordance with an embodiment of the present disclosure. FIG. 7 may illustrate both a case A in which the first division circuit 610 and the second division circuit 640 generate the first internal clock signal ICLK1 and the first internal clock signal ICLK2, respectively, in synchronization with the rising edge with substantially the same sequence number of the clock signal CLK, and a case B in which the first division circuit 610 generates the first internal clock signal ICLK1 in synchronization with an odd-numbered rising edge OD of the clock signal CLK, whereas the second division circuit 640 generates the first internal clock signal ICLK2 in synchronization with an even-numbered rising edge EV of the clock signal CLK. In the case A, the command synchronization circuit 650 may generate the internal control signal IODT after a time corresponding to the latency information LT by synchronizing the delay command signal DCMD with the first internal clock signal ICLK2. In the case B, because the command synchronization circuit 650 synchronizes the delay command signal DCMD with the first internal clock signal ICLK2 generated in synchronization with the even-numbered rising edge of the clock signal CLK, the timing at which the delayed command signal DCMD is synchronized with the first internal clock signal ICLK2 in the case B may be advanced by one cycle (1$t$CK) of the clock signal CLK as compared with the timing at which the delayed command signal DCMD is synchronized with the first internal clock signal ICLK2 in the case A. When the synchronization timing of the delay command signal DCMD is advanced, the internal control signal IODT may be enabled before the time corresponding to the latency information LT, and the operation timing of the data transmission circuit 690 may be earlier than the normal timing. Accordingly, an abnormal operation in which the data transmission circuit 690 outputs erroneous data to the outside may occur. The semiconductor apparatus 600 may adjust the timing at which the second division circuit 640 generates the second group of internal clock signals ICLK2, QCLK2, IBCLK2, and QBCLK2 based on one of the first group of internal clock signals ICLK1, QCLK1, IBCLK1, and QBCLK1 generated by the first division circuit 610, and cause all the internal clock signals of the first and second groups to be generated in synchronization with the rising edge with substantially the same subsequence number of the clock signal CLK, thereby substantially preventing the abnormal operation of the data transmission circuit 690.

A person skilled in the art to which the present disclosure pertains will appreciate that the present disclosure may be carried out in other specific forms without changing its technical spirit or essential features. Therefore, the embodiments described above are illustrative in all aspects, not limitative. The scope of the present disclosure is defined by the claims provided below rather than the detailed description, and it should be construed that all changes or modified forms derived from the meaning and scope of the claims and the equivalent concept thereof are included in the scope of the present disclosure.

What is claimed is:

1. A clock generating circuit comprising:
    a first division circuit configured to generate a first group of internal clock signals by dividing a clock signal;
    an internal circuit configured to generate a delayed clock signal by delaying the clock signal based on an enable signal;
    a second division circuit configured to generate a second group of internal clock signals by dividing the delayed clock signal; and
    an enable control circuit configured to generate the enable signal based on one of the first group of internal clock signals.

2. The clock generating circuit according to claim 1, wherein the internal circuit comprises:
    a buffer circuit configured to buffer the clock signal based on the enable signal; and
    a delay circuit configured to generate the delayed clock signal by delaying an output signal of the buffer circuit.

3. The clock generating circuit according to claim 1, wherein the enable control circuit is configured to generate the enable signal based on an internal clock signal having a most lagging phase among the first group of internal clock signals.

4. The clock generating circuit according to claim 1, wherein the first group of internal clock signals include a first internal clock signal, a second internal clock signal, a third internal clock signal, and a fourth internal clock signal that sequentially have a phase difference of 90°, and
    wherein the enable control circuit is configured to enable the enable signal in synchronization with a rising edge of the fourth internal clock signal.

5. The clock generating circuit according to claim 1, wherein the second division circuit is configured to be activated based on the enable signal.

6. A clock generating circuit comprising:
    a first division circuit configured to generate a first group of internal clock signals by dividing a clock signal;
    a buffer circuit configured to buffer the clock signal based on an enable signal;
    a delay locked loop circuit configured to generate a delayed clock signal by delaying an output signal of the buffer circuit;
    a second division circuit configured to generate a second group of internal clock signals by dividing the delayed clock signal; and
    an enable control circuit configured to generate the enable signal based on a delay locked loop reset signal and one of the first group of internal clock signals.

7. The clock generating circuit according to claim 6, wherein the delay locked loop circuit is configured to be activated based on the delay locked loop reset signal.

8. The clock generating circuit according to claim 6, wherein the delay locked loop circuit comprises:
    a delay circuit configured to generate the delayed clock signal by delaying the output signal of the buffer circuit; and
    a delay control circuit configured to generate the delay locked loop reset signal based on the clock signal and to change a delay time of the delay circuit.

9. The clock generating circuit according to claim 6, wherein the second division circuit is configured to be activated based on the enable signal.

10. The clock generating circuit according to claim 6, wherein the enable control circuit is configured to generate the enable signal based on an internal clock signal having a most lagging phase among the first group of internal clock signals.

11. The clock generating circuit according to claim 6, wherein the enable control circuit is configured to output the delay locked loop reset signal as the enable signal in synchronization with a rising edge of an internal clock signal having a most lagging phase among the first group of internal clock signals.

12. The clock generating circuit according to claim 6, wherein the first group of internal clock signals include a first internal clock signal, a second internal clock signal, a third internal clock signal, and a fourth internal clock signal that sequentially have a phase difference of 90°, and wherein the enable control circuit is configured to output the delay locked loop reset signal as the enable signal in synchronization with the fourth internal clock signal.

13. A semiconductor apparatus comprising:

a first division circuit configured to generate a first group of internal clock signals by dividing a clock signal;

a command path circuit configured to generate an internal command signal by synchronizing a command signal with at least one of the first group of internal clock signals and to generate a delayed command signal by delaying the internal command signal;

a clock path circuit configured to be activated based on one of the first group of internal clock signals and configured to generate a delayed clock signal by delaying a phase of the clock signal;

a second division circuit configured to generate a second group of internal clock signals by dividing the delayed clock signal; and a command synchronization circuit configured to generate an internal control signal by synchronizing the delayed command signal with at least one of the second group of internal clock signals.

14. The semiconductor apparatus according to claim 13, wherein the command path circuit comprises:

a command decoder configured to generate the internal command signal by decoding the command signal synchronized with at least one of the first group of internal clock signals; and a command delay circuit configured to generate the delayed command signal by delaying the internal command signal.

15. The semiconductor apparatus according to claim 13, wherein the clock path circuit is configured to be activated based on an internal clock signal having a most lagging phase among the first group of internal clock signals.

16. The semiconductor apparatus according to claim 13, wherein the first group of internal clock signals include a first internal clock signal, a second internal clock signal, a third internal clock signal, and a fourth internal clock signal that sequentially have a phase difference of 90°, and wherein the clock path circuit is configured to be activated in synchronization with the fourth internal clock signal.

17. The semiconductor apparatus according to claim 13, wherein the second division circuit is configured to be activated based on an internal clock signal having a most lagging phase among the first group of internal clock signals.

18. The semiconductor apparatus according to claim 13, further comprising:

an enable control circuit configured to generate an enable signal based on at least one of the first group of internal clock signals.

19. The semiconductor apparatus according to claim 18, wherein the clock path circuit comprises:

a buffer circuit configured to be activated based on the enable signal and configured to buffer the clock signal; and a clock delay circuit configured to generate the delayed clock signal by delaying an output signal of the buffer circuit.

20. The semiconductor apparatus according to claim 18, wherein the second division circuit is configured to be activated based on the enable signal.

* * * * *